United States Patent
Lin

(10) Patent No.: US 9,258,886 B2
(45) Date of Patent: Feb. 9, 2016

(54) PRINTED CIRCUIT BOARD HAVING DIFFERENTIAL LINE PAIRS WITH A PERCENTAGE OF THEIR LENGTHS DISPOSED AS AN OUTER SIGNAL LAYER

(71) Applicant: HON HAI PRECISION INDUSTRY CO., LTD., New Taipei (TW)

(72) Inventor: Yu-Hsu Lin, Santa Clara, CA (US)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 256 days.

(21) Appl. No.: 13/726,543

(22) Filed: Dec. 25, 2012

(65) Prior Publication Data

US 2013/0162364 A1    Jun. 27, 2013

(30) Foreign Application Priority Data

Dec. 27, 2011   (CN) .......................... 2011 1 0443940

(51) Int. Cl.
| | |
|---|---|
| H05K 1/02 | (2006.01) |
| H01P 3/04 | (2006.01) |
| H01P 3/08 | (2006.01) |
| H01P 3/02 | (2006.01) |
| H05K 3/46 | (2006.01) |

(52) U.S. Cl.
CPC .............. *H05K 1/0245* (2013.01); *H01P 3/026* (2013.01); *H01P 3/04* (2013.01); *H01P 3/08* (2013.01); *H05K 1/0219* (2013.01); *H05K 3/4617* (2013.01); *H05K 2201/0723* (2013.01)

(58) Field of Classification Search
CPC .......... H01P 3/082; H01P 3/088; H01P 3/04; H05K 1/0245; H05K 1/0218; H05K 1/0219; H05K 1/0224
USPC ......................................................... 333/4, 5
See application file for complete search history.

(56) References Cited

U.S. PATENT DOCUMENTS

| | | | |
|---|---|---|---|
| 2002/0070826 A1* | 6/2002 | Aruga ............................ | 333/246 |
| 2006/0139117 A1* | 6/2006 | Brunker et al. ................... | 333/1 |
| 2009/0242244 A1* | 10/2009 | Hsu et al. ....................... | 174/255 |

FOREIGN PATENT DOCUMENTS

| | | |
|---|---|---|
| TW | I306009 | 2/2009 |
| TW | 200944081 A | 10/2009 |
| TW | 201141332 A1 | 11/2011 |

* cited by examiner

*Primary Examiner* — Benny Lee
(74) *Attorney, Agent, or Firm* — Novak Druce Connolly Bove + Quigg LLP

(57) ABSTRACT

A printed circuit board includes an outer signal layer, a first ground layer, a first ground layer located below the outer signal layer, an inner signal layer located below the first ground layer, an second ground layer located below the inner signal layer, and a first differential signal transmission pair and a second differential signal transmission pair laid on the outer signal layer and the inner signal layer. A value h is equal to a distance between the inner signal layer and its closest ground layer. A distance between the first pair and the second pair is not more than h×3.

11 Claims, 6 Drawing Sheets

PRINTED CIRCUIT BOARD HAVING DIFFERENTIAL LINE PAIRS WITH A PERCENTAGE OF THEIR LENGTHS DISPOSED AS AN OUTER SIGNAL LAYER

BACKGROUND

1. Technical Field

The present disclosure relates to printed circuit boards that can save layout space on the printed circuit board.

2. Description of Related Art

Common-mode noise in signals is rejected by using differential signal transmission line pair that has a first transmission line and a second transmission line. When the differential signal transmission line pair routed on a printed circuit board (PCB), opposite ends of the differential signal transmission line pair are routed on an outer signal layer of the PCB, and middle portions of the differential signal transmission line pair are routed an inner signal layer of the PCB. The portions of the differential signal transmission line pair which are routed on the outer signal layer of the PCB are called microstrip lines. The portions of the differential signal transmission line pair which are routed on the inner signal layer of the PCB are called striplines.

Further, crosstalk is the electrical "noise" caused by mutual inductance and mutual capacitance between differential signal transmission line pairs, due to the close proximity of the differential signal transmission line pairs to each other. Crosstalk can cause digital system failure due to false signals appearing on a receiver. A typical layout method for reducing the crosstalk is to increase the distance between the two differential signal transmission line pairs, which occupies extra space and increases cost.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION OF THE INVENTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
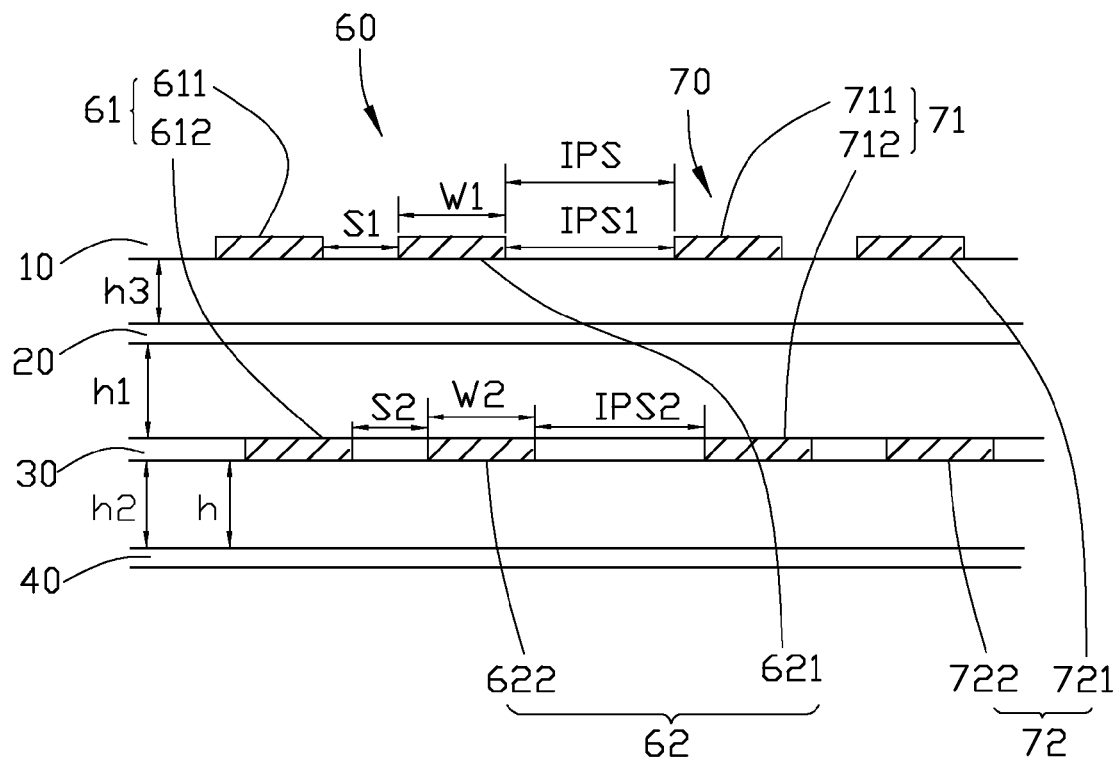
FIG. 1 is a sketch view of an embodiment of a printed circuit board.
Figure 6:
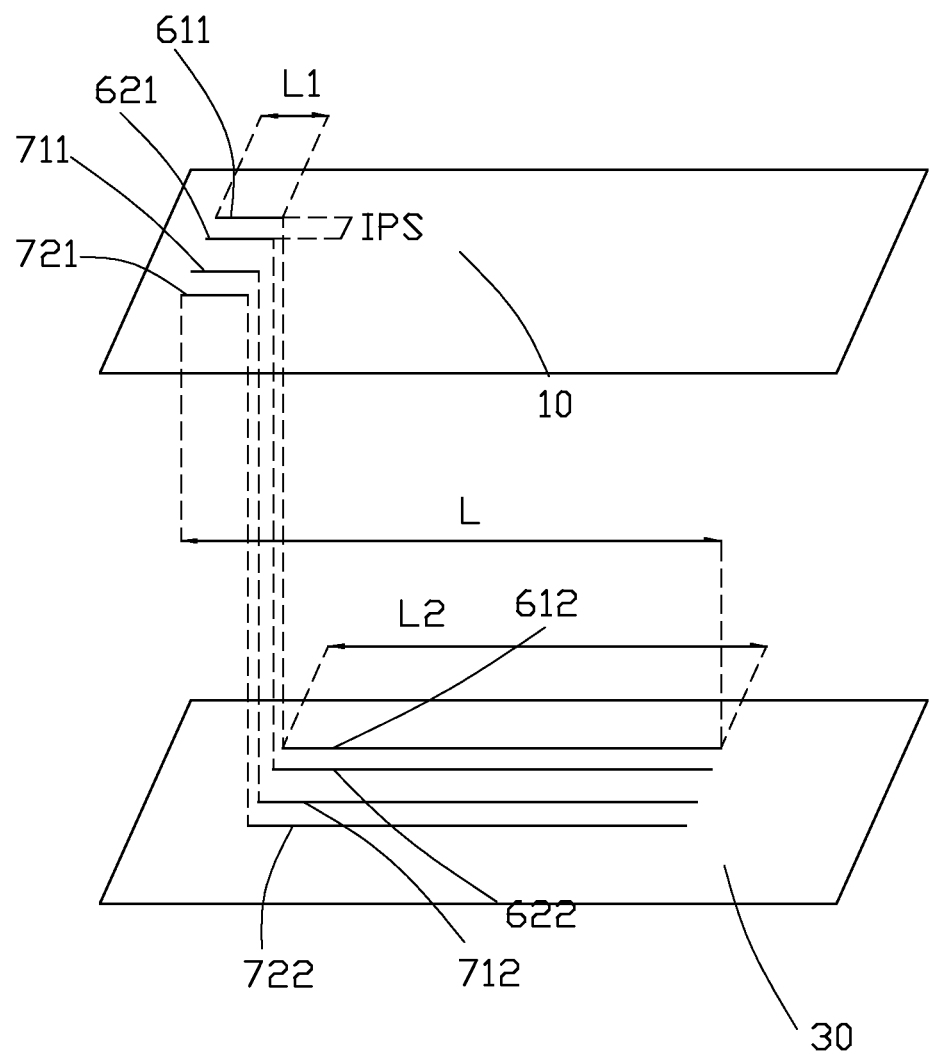
FIG. 6 is a sketch view of a sketch view of the printed circuit board of FIG. 1.

Referring to FIGS. 1, and 6, a printed circuit board in accordance with an embodiment includes an outer signal layer 10, a first ground layer 20, an inner signal layer 30, and a second ground line 40. The outer signal layer 10, the first ground layer 20, the inner signal layer 30, and the second ground line 40 are separated by insulating layers. The first ground layer 20 is located between the outer signal layer 10 and the inner signallayer 30. The inner signal layer 30 is located between the first ground layer 20 and the second ground layer 40. A first differential signal transmission pair 60 and a second differential signal transmission line pair 70 are routed on the printed circuit board. The first differential signal transmission line pair 60 is parallel to the second differential signal transmission pair 70. A first distance h1 is defined between the inner signal layer 30 and the first ground layer 20. A second distance h2 is defined between the inner signal layer 30 and the second ground layer 40. A third distance h3 is defined between the outer signal layer 10 and the first ground layer 20. The first differential signal transmission pair 60 and the second differential signal transmission pair 70 have the same length, L (FIG. 6). A value h represents equality with the smaller one of the first distance h1 and the second distance h2.

The first differential signal transmission line pair 60 includes a first positive transmission line 61 and a first negative transmission line 62. The first positive transmission line 61 includes a first positive microstrip line 611, which is routed on the outer signal layer 10, and a first positive stripline 612, which is routed on the inner signal layer 30. The first negative transmission line 62 includes a first negative microstrip line 621, which is routed on the outer signal layer 10, and a first negative stripline 622, which is routed on the inner signal layer 30. The first positive microstrip line 611 and the first negative microstrip line 621 compose a first microstrip line pair. The first positive stripline 612 and the first negative stripline 622 compose a first stripline pair. Lengths of the first positive microstrip line 611 and the first negative microstrip line 621 are both L1 (FIG. 6). Therefore, a first microstrip line pair length is L1. Lengths of the first positive stripline 612 and the first negative stripline 622 are both L2 (FIG. 6). Therefore, a first stripline pair length is L2. Widths of the first positive microstrip line 611 and the first negative microstrip line 621 are both W1. Widths of the first positive stripline 612 and the first negative stripline 622 are both W2. A distance between the first positive microstrip line 611 and the first negative microstrip line 621 is S1. A distance between the first positive stripline 612 and the first negative stripline 622 is S2.

The second differential signal transmission line pair 70 includes a second positive transmission line 71 and a second negative transmission line 72. The second positive transmission line 71 includes a second positive microstrip line 711, which is routed on the outer signal layer 10, and a second positive stripline 712, which is routed on the inner signal layer 30. The second negative transmission line 72 includes a second negative microstrip line 721, which is routed on the outer signal layer 10, and a second negative stripline 722, which is routed on the inner signal layer 30. The second positive microstrip line 711 and the second negative microstrip line 721 compose a second microstrip line pair. The second positive stripline 712 and the second negative stripline 722 compose a second stripline pair. Lengths of the second positive microstrip line 711 and the second negative microstrip line 721 are both L1. Therefore, a second microstrip line pair length is L1. Lengths of the second positive stripline 712 and the second negative stripline 722 are both L2. Therefore, a second stripline pair length is L2. Widths of the second positive microstrip line 711 and the second negative microstrip line 721 are both W1. Widths of the second positive stripline 712 and the second negative stripline 722 are both W2. A distance between the second positive microstrip line 711 and the second negative microstrip line 721 is S1. A distance between the second positive stripline 712 and the second negative stripline 722 is S2.

A distance between the first microstrip line pair and the second microstrip line pair is IPS1. A distance between the first stripline pair and the second stripline pair is IPS2. The values of the distance IPS1 is related to distance h3. The values of the distance IPS2 is related to the smaller one of the first distance h1 and the second distance h2. In the embodiment, the distances IPS1 and IPS2 are both set to be a distance IPS. In other words, the value of the distances IPS1 and IPS2 are related to the value h.

In one embodiment, the first distance h1 is 5 mils, the second distance h2 is 4 mils, the third distance h3 is 2.7 mils, the widths W1 and W2 are 5 mils, the distance S1 is 7 mils, the distance S2 is 6.5 mils, the distance IPS1 is 24 mils and the distance IPS2 is 12 mils. Therefore, the value h is 4 mils. A signal generator (not shown) is connected to input ends of the first differential signal transmission pair 60 and the second differential signal transmission line pair 70. An oscillograph (not shown) is connected to output ends of the first differential signal transmission pair 60 and the second differential signal transmission pair 70. A frequency of the signal generator in transmitting data is 8G bit/s. A bit error rate of the transmission receiving data is a portion of error bits of all transmission receiving bits is not more then 0.000000000001.

Figure 2:
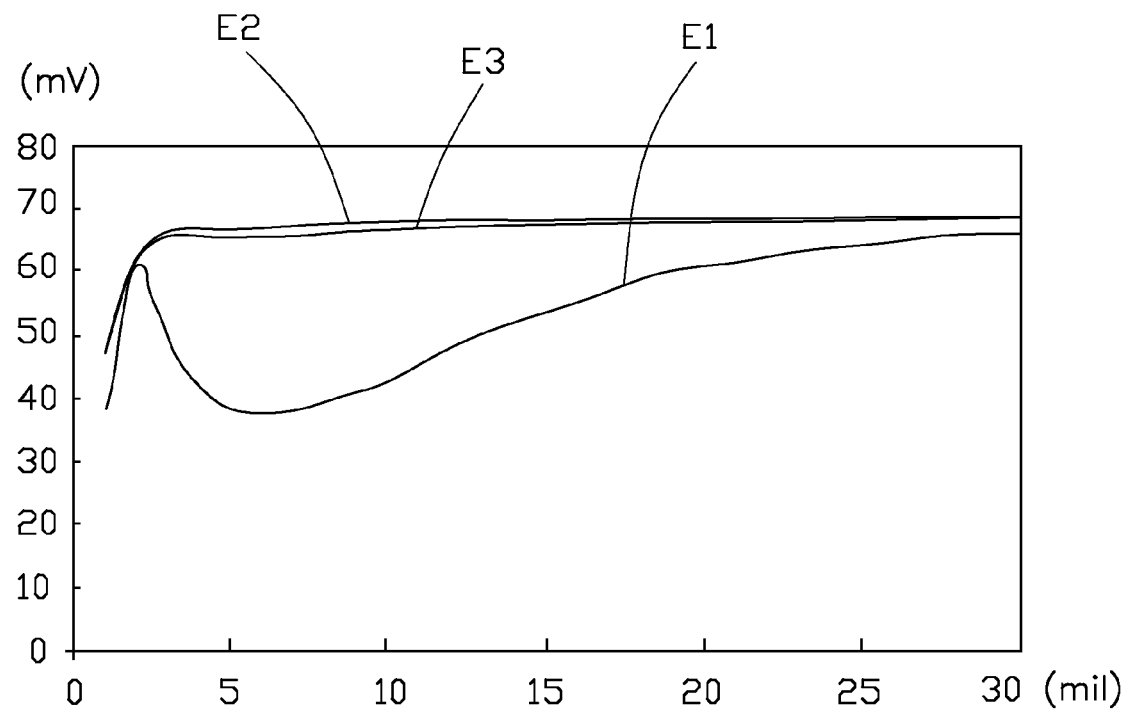
FIG. 2 is an oscillographic trace showing a signal waveform of a relationship between the differential transmission lines distance and eye width in eye diagram, in accordance with an embodiment.

Referring to FIG. 2, in simulation, to obtain a signal waveform of relationship between the distance IPS (FIG. 1) and eye width in eye diagram as shown in FIG. 2, the distance IPS is changed. E1 represents the eye size vs. IPS when E1 is a pure microstrip signal with length L. E2 represents the eye size vs. IPS when E2 is a pure stripline signal with length L. E3 represents the eye size vs. IPS when E3 is a mixed signal line including microstrip line and stripline with total length L and L1(microstrip)/L<10%. For microstrip lines 611, 621, 711, and 721, the microstrip line eye width E1 increases incrementally along the distance IPS. When the distance IPS is equal to 2 mils, the microstrip line eye width E1 reaches a wave peak value. When the distance IPS increases from 2 mils to 7 mils, the microstrip line eye width E1 decreases. The microstrip line eye width E1 reaches a wave hollow value when the distance IPS is 7 mils. When the distance IPS increases 7 mils, the microstrip line eye width E1 increases. For striplines 612, 622, 712, and 722, the stripline eye width E2 increases incrementally along the distance IPS. When the distance IPS increases beyond 3 mils, the stripline eye width E2 is substantially constant.

Referring to FIG. 2, in one embodiment, the length L of the first differential signal transmission pair 60 and the second differential signal transmission line pair 70 are set to 8 inches, and L1/L is set to 4.5%. A first differential pair eye width E3 of the first differential signal transmission pair 60 and the second differential signal transmission pair 70 increases incrementally along the distance IPS. When the value IPS increases beyond 4 mils, the first differential pair eye width E3 is constant. Therefore, when the distance IPS is equal to or larger than 4 mils (equal to h), the first differential signal transmission pair 60 and the second differential signal transmission pair 70 can transmit clear and clean signals. In another aspect, for saving space, the distance IPS is set to be equal to or smaller than 12 mils (equal to h×3).

Figure 3:
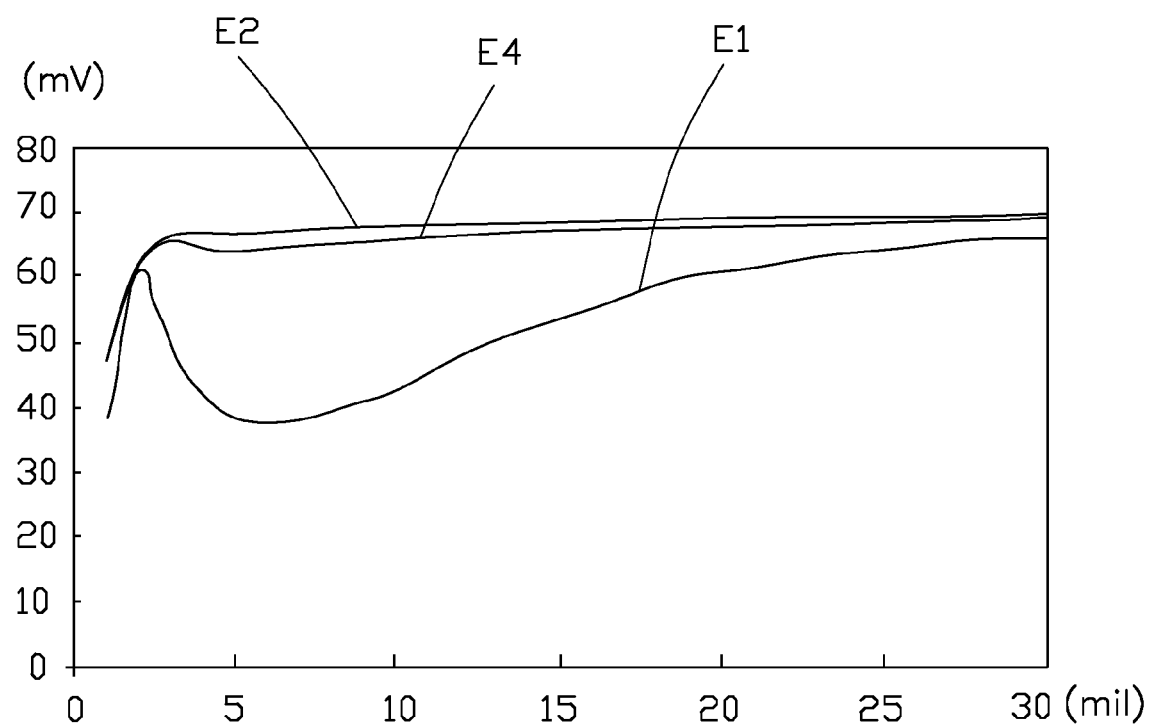
FIG. 3 is an oscillographic trace showing a signal waveform of a relationship between the differential transmission lines distance and eye width in eye diagram, in accordance with another embodiment.

Referring to FIG. 3, in another embodiment, the length L of the first differential signal transmission pair 60 and the second differential signal transmission pair 70 is set to 8 inches. E4 represents the eye size vs. IPS when E4 is a mixed signal line including microstrip line and stripline with total length L and L1(microstrip)/L<10%. A second differential pair eye width E4 of the first differential signal transmission pair 60 and the second differential signal transmission pair 70 increases incrementally along the distance IPS. When the distance IPS is equal to 3 mils, the second differential pair eye width E4 reaches a wave peak value. When the distance IPS increases from 3 mils to 5 mils, the second differential pair eye width E4 decreases. The second differential pair eye width E4 reaches a wave hollow value when the distance IPS is 5 mils. When the distance IPS increase beyond 5 mils, the second differential pair eye width E4 increases. When the distance IPS increase from 25 mils, the second differential pair eye width E4 is substantially constant. However, even when the distance IPS is only 4 mils, the second differential pair eye width E4 is large enough to ensure maintain sufficient integrity in the signals being transmitted. In another aspect, for saving space, the distance IPS should equal to or smaller than 12 mils. Therefore, the distances IPS is set between (equal to h) 4 mils and 12 mils (equal to h×3).

The above printed circuit board saves a distance of 24 mil–5 mil=19 mils on the outer signal layer 10, and saves a distance of 12 mil–5 mil=7 mils on the inner signal layer 30. It is apparent that the embodiment of the printed circuit board saves a plurality of space.

Therefore, for differential signal transmission line pairs of the embodiment of the printed circuit board, the distance IPS1 and the distance IPS2 are both set to be equal to IPS, and kept in the range of h and h×3 to saves a plurality of space and ensure high-quality signals. In another aspect, L1/L is kept to not more than 10% to ensure good signals.

In another embodiment, the first positive transmission line 61 can be set to include a plurality of first positive microstrip lines and a plurality of first positive striplines. A total length of plurality of first positive microstrip lines is set to be not more than 10% of the length of the first positive transmission line 61. The first negative transmission line 62, the second positive transmission line 71 and the second negative transmission line 72 can also be set as the above first positive transmission line 61 to include a plurality of microstrip lines and a plurality of striplines.

Figure 4:
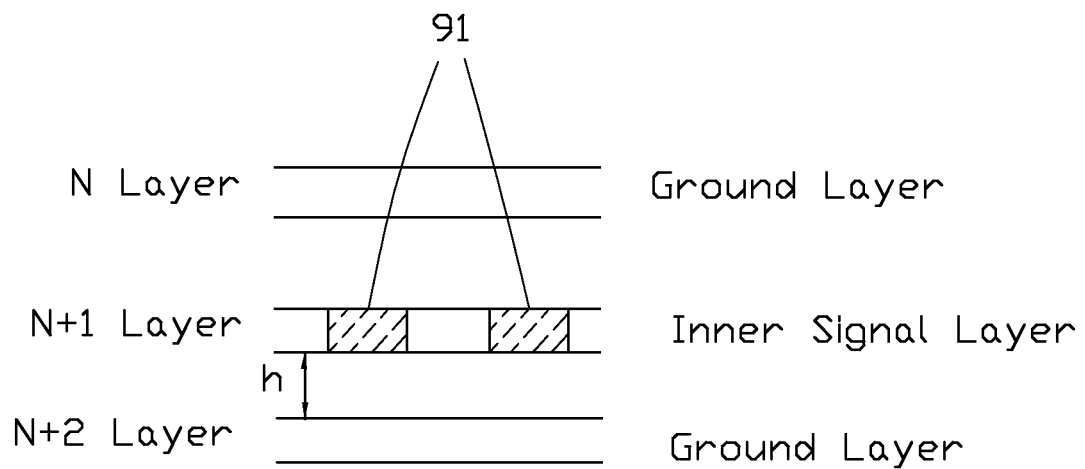
FIG. 4 is a sketch view of another embodiment of a printed circuit board.
Figure 5:
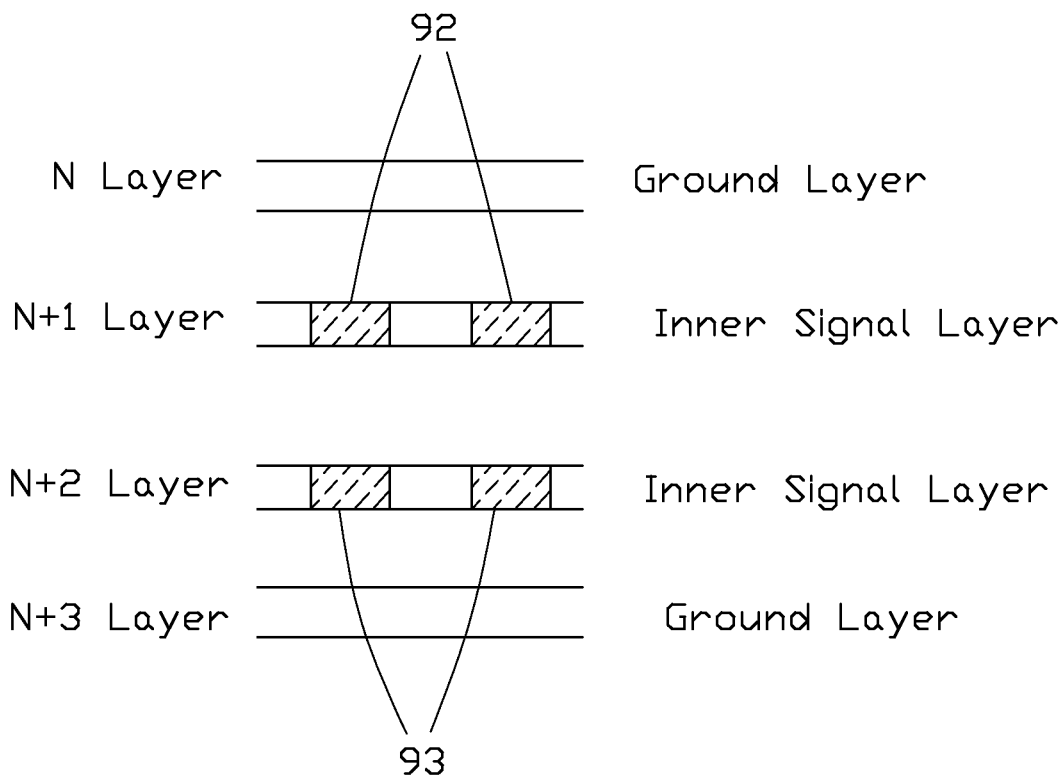
FIG. 5 is a sketch view of another more embodiment of a printed circuit board.

Further, in the embodiment, the inner signal layer 30 is not limited to be routed on a third layer (the inner signal line 30) of the printed circuit board. Any inner signal layers of the printed circuit can be used to receive the stripline laid thereon. Please referring to FIG. 4, a printed circuit board includes an N layer, an N+1 layer, and an N+2 layer. The N layer and the N+2 layer are ground layers. The N+1 layer is an inner signal layer. A plurality of striplines 91 are routed on the N+1 layer. The value h is the distance between the signal layer (the N+1 layer) and its closest ground layer (N+2 layer). Because the N+1 layer is closer to the N+2 layer than the N layer, the value h is equal to the distance between the N+1 layer and the N+2 layer. Please referring to FIG. 5, another printed circuit board includes an N layer, an N+1 layer, an N+2 layer, and an N+3 layer. The N layer and the N+3 layer are ground layers. The N+1 layer and the N+2 layer are inner signal layers. The N+1 layer and the N+2 layer both have a plurality of striplines 92 laid thereon. A distance between the N+1 layer and the N layer is same as a distance between the N+2 layer and the N+3 layer. Because the value h is the distance between the signal layer and its closest ground layer, the value h is equal to the distance between the N+1 layer and the N layer or the distance between the N+2 layer and the N+3 layer.

It is to be understood, however, that even though numerous characteristics and advantages of the embodiments have been set forth in the foregoing description, together with details of the structure and functions of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A printed circuit board, comprising:
an outer signal layer;
a first ground layer located below the outer signal layer;
an inner signal layer located below the first ground layer;
an second ground layer located below the inner signal layer;
a first differential signal transmission line pair and a second differential signal transmission line pair routed on each one of the outer signal layer and the inner signal layer, the first differential signal transmission line pair are parallel to the second differential signal transmission line pair that are routed on the outer signal layer; a value h is equal to a distance between the inner signal layer and the closest one of first and second ground layers, and a distance between the first differential signal transmission line pair and the second differential signal transmission line pair routed on the outer signal layer or the inner signal layer is not more than h×3;
wherein part of the first differential signal transmission line pair which are placed on the outer signal layer is a first microstrip line pair, and a length of the first microstrip line pair is not more than 10% of a length of the first differential signal transmission line pair; part of the second differential signal transmission line pair which is placed on the outer signal layer is a second microstrip line pair, and a length of the second microstrip line pair is not more than 10% of a length of the second differential signal transmission line pair.

2. The printed circuit board of claim 1, wherein the distance between the first differential signal transmission line pair and the second differential signal transmission line pair routed on the outer signal layer or the inner signal layer is not smaller than h.

3. The printed circuit board of claim 1, wherein the outer signal layer, the first ground layer, the inner signal layer, and the second ground line are separated by insulating layers.

4. The printed circuit board of claim 1, wherein the first differential signal transmission line pair which is placed on the inner signal layer comprises at least one first stripline pair, and a length of the at least one first stripline pair is more than 90% of a length of the first differential signal transmission line pair; the second differential signal transmission line pair which is placed on the inner signal layer comprises at least one second stripline pair, and a length of the at least one second stripline pair is more than 90% of a length of the second differential signal transmission line pair.

5. The printed circuit board of claim 1, further comprising another inner signal layer, wherein at least one first stripline pair comprises two first stripline pairs, one of the two first stripline pairs is routed on the inner signal layer, and another one of the two first stripline pairs is routed on the another inner signal layer, and a length of the two first stripline pairs is more than 90% of the first differential signal transmission line pair length; at least one second stripline pair comprises two second stripline pairs, one of the two second stripline pairs is routed on the inner signal layer, and another one of the second two stripline pairs is routed on the another inner signal layer, and a length of the two second stripline pairs is more than 90% of the second differential signal transmission line pair length.

6. A printed circuit board, comprising:
an outer signal layer;
an inner signal layer located below the outer signal layer;
a first ground layer located between the outer signal layer and the inner signal layer;
an second ground layer located below the inner signal layer;
a first differential signal transmission line pair and a second differential signal transmission line pair routed on both of the outer signal layer and the inner signal layer, the first differential signal transmission line pair comprising at least one first microstrip line pair which are placed on the outer signal layer, and the second differential signal transmission line pair comprising at least one second microstrip line pair which is placed on the outer signal layer;
wherein a length of the at least one first microstrip line pair is not more than 10% of a length of first differential signal transmission line pair, and a length of the at least one second microstrip line pair is not more than 10% of a length of second differential signal transmission line pair.

7. The printed circuit board of claim 6, further comprising another inner signal layer, wherein at least one first stripline pair comprises two first stripline pairs, one of the two first stripline pairs is routed on the inner signal layer, and another one of the two first stripline pairs is routed on the another inner signal layer, and a length of the two first stripline pairs is more than 90% of the first differential signal transmission line pair length; at least one second stripline pair comprises two second stripline pairs, one of the two second stripline pairs is routed on the inner signal layer, and another one of the second two stripline pairs is routed on the another inner signal layer, and a length of the two second stripline pairs is more than 90% of the second differential signal transmission line pair length.

8. The printed circuit board of claim 6, wherein a value h is equal to a distance between the inner signal layer and the closest one of first and second ground layers, and a distance between the first differential signal transmission line pair and the second differential signal transmission line pair routed on the outer signal layer or the inner signal layer is not more than h×3.

9. The printed circuit board of claim 8, wherein the distance between the first differential signal transmission line pair and the second differential signal transmission line pair routed on the outer signal layer is not smaller than h.

10. The printed circuit board of claim 8, wherein the outer signal layer, the first ground layer, the inner signal layer, and the second ground line are separated by insulating layers.

11. The printed circuit board of claim 6, wherein the first differential signal transmission line pair pair which is placed on the inner signal layer comprises at least one first stripline pair, and a length of the at least one first stripline pair is more than 90% of a length of the first differential signal transmission line pair; the second differential signal transmission line pair which is placed on the inner signal layer comprises at least one second stripline pair, and a length of the at least one second stripline pair is more than 90% of a length of the second differential signal transmission line pair.

* * * * *